(12) United States Patent
Kim

(10) Patent No.: US 8,772,823 B2
(45) Date of Patent: Jul. 8, 2014

(54) LIGHT-EMITTING DEVICES

(71) Applicant: Samsung Electronics Co., Ltd., Suwon-Si (KR)

(72) Inventor: Yu-Sik Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/961,182

(22) Filed: Aug. 7, 2013

(65) Prior Publication Data

US 2013/0320300 A1 Dec. 5, 2013

Related U.S. Application Data

(63) Continuation of application No. 13/624,220, filed on Sep. 21, 2012, now Pat. No. 8,546,843, which is a continuation of application No. 13/447,667, filed on Apr. 16, 2012, now Pat. No. 8,299,492, which is a continuation of application No. 12/662,081, filed on Mar. 30, 2010, now Pat. No. 8,183,591.

(30) Foreign Application Priority Data

Mar. 31, 2009 (KR) .................. 10-2009-0027699

(51) Int. Cl.
*H01L 33/00* (2010.01)

(52) U.S. Cl.
USPC ..................................... 257/99; 257/E33.066

(58) Field of Classification Search
USPC ............................................ 257/99, E33.062
See application file for complete search history.

(56) References Cited

U.S. PATENT DOCUMENTS 6,703,253 B2 3/2004 Koide
7,569,865 B2 8/2009 Lee et al.

FOREIGN PATENT DOCUMENTS

JP 2004-343138 A 12/2004
JP 2007-142345 A 6/2007
KR 10-2005-0063923 A 6/2005

*Primary Examiner* — Marvin Payen
(74) *Attorney, Agent, or Firm* — Harness, Dickey & Pierce, P.L.C.

(57) ABSTRACT

Light-emitting devices are provided, the light-emitting devices include a light-emitting structure layer having a first conductive layer, a light-emitting layer and a second conductive layer sequentially stacked on a first of a substrate, a plurality of seed layer patterns formed apart each other in the first conductive layer; and a plurality of first electrodes formed through the substrate, wherein each of the first electrodes extends from a second side of the substrate to each of the seed layer patterns.

8 Claims, 14 Drawing Sheets

LIGHT-EMITTING DEVICES

CROSS REFERENCE TO RELATED APPLICATIONS

This application is a continuation application of U.S. application Ser. No. 13/624,220, filed on Sep. 21, 2012, now allowed, which is a continuation application of U.S. application Ser. No. 13/447,667, filed on Apr. 16, 2012, now U.S. Pat. No. 8,299,492, which is a continuation application of U.S. application Ser. No. 12/662,081, filed on Mar. 30, 2010, now U.S. Pat. No. 8,183,591, which claims the benefit of priority under 35 U.S.C. §119 from Korean Patent Application No. 10-2009-0027699 filed on Mar. 31, 2009, in the Korean Intellectual Property Office, the disclosures of each of which are herein incorporated by reference in their entirety.

BACKGROUND

1. Technical Field

Example embodiments of the present inventive concepts relate to light-emitting devices. More particularly, example embodiments of the present inventive concepts relate to light-emitting devices that provide increased light emission efficiency, heat dissipation efficiency and reliability.

2. Description of the Related Art

Light-emitting devices can be categorized into various types including vertical type light-emitting devices, lateral type light-emitting devices and flip-chip type light-emitting devices.

Vertical type light-emitting devices are widely used due to small form factor components and/or increased current spreading characteristics. An example of vertical type light-emitting devices includes a light-emitting structure where an n-type GaN pattern, a light-emitting layer pattern and a p-type GaN pattern are stacked. In the light-emitting layer pattern, carriers (electrons) of an n-type GaN pattern and carriers (holes) of a p-type GaN pattern are combined to generate light.

In the vertical type light-emitting devices, in order to form electrode on both sides of the light-emitting structure, lift-off methods (e.g., a Chemical Lift Off (CLO) method or a Laser Lift Off (LLO) method) are used to remove a substrate from the light-emitting structure. When the substrate is removed from the light-emitting structure, the light-emitting structure may be damaged.

If substrate is not removed from the light-emitting structure of the vertical type light-emitting device, heat dissipation efficiency may be reduced.

SUMMARY

Example embodiments of the present inventive concepts relate to light-emitting devices. Example embodiments of the present inventive concepts provide light-emitting devices with increased light emission efficiency, heat dissipation efficiency and reliability.

Additional advantages, objects and features of example embodiments of the inventive concepts will be set forth in part in the description which follows and in part will become apparent to those having ordinary skill in the art upon examination of the following or may be learned from practice of example embodiments of the inventive concepts.

In example embodiments of the present inventive concepts, there is provided a light-emitting device, which includes a light-emitting structure layer having a first conductive layer, a light-emitting layer and a second conductive layer sequentially stacked on one side of a substrate. The light-emitting device further includes a plurality of seed layer patterns formed apart each other in the first conductive layer, and a plurality of first electrodes formed through the substrate. Each of the first electrodes extends from the other side of the substrate to each of the seed layer patterns.

BRIEF DESCRIPTION OF THE DRAWINGS

The above and other features and advantages of the present invention will become apparent by describing in detail example embodiments thereof with reference to the attached drawings in which.

DETAILED DESCRIPTION OF EXAMPLE EMBODIMENTS

Figure 1:
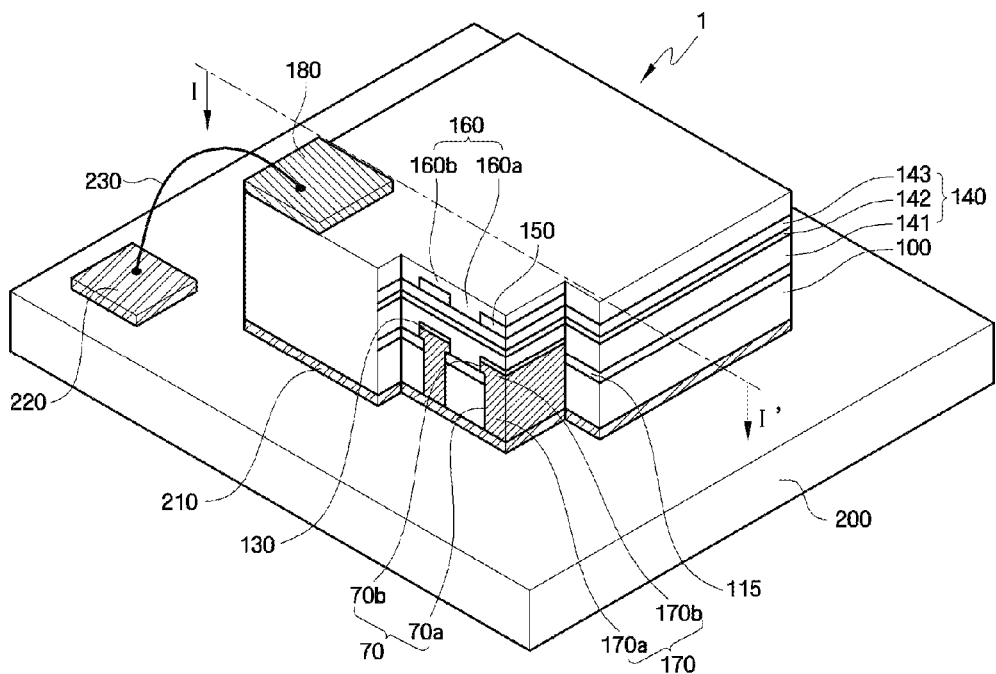
FIG. 1 is a perspective view illustrating a light-emitting device according to example embodiments of the inventive concepts.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

In order to more specifically describe example embodiments, various aspects will be described in detail with reference to the attached drawings. However, the present invention is not limited to example embodiments described.

Example embodiments of the present inventive concepts relate to light-emitting devices. More particularly, example embodiments of the present inventive concepts relate to light-emitting devices that provide increased light emission efficiency, heat dissipation efficiency and reliability.

Hereinafter, referring to FIGS. 1 through 4, a light-emitting device according to example embodiments is described in detail.

Figure 2:
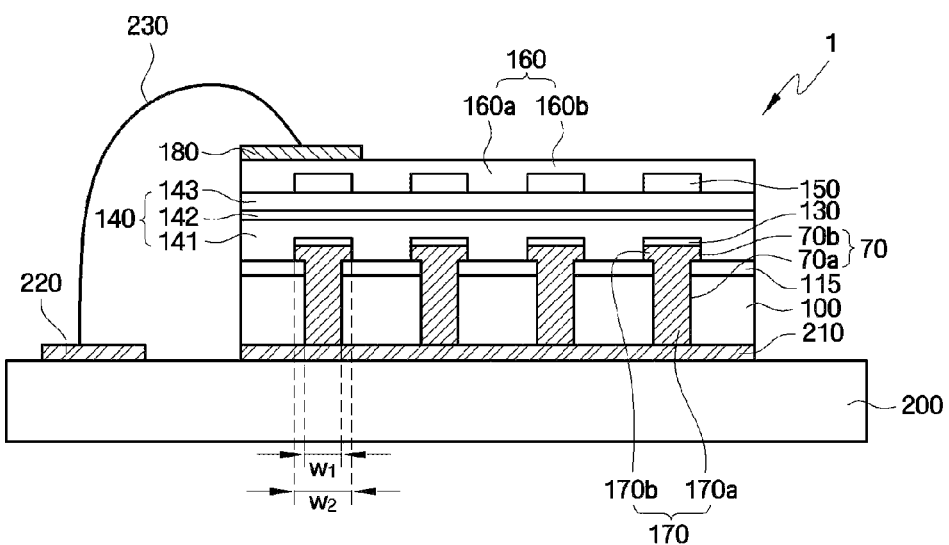
FIG. 2 is a sectional view taken along a line I-I' of FIG. 1.
Figure 3:
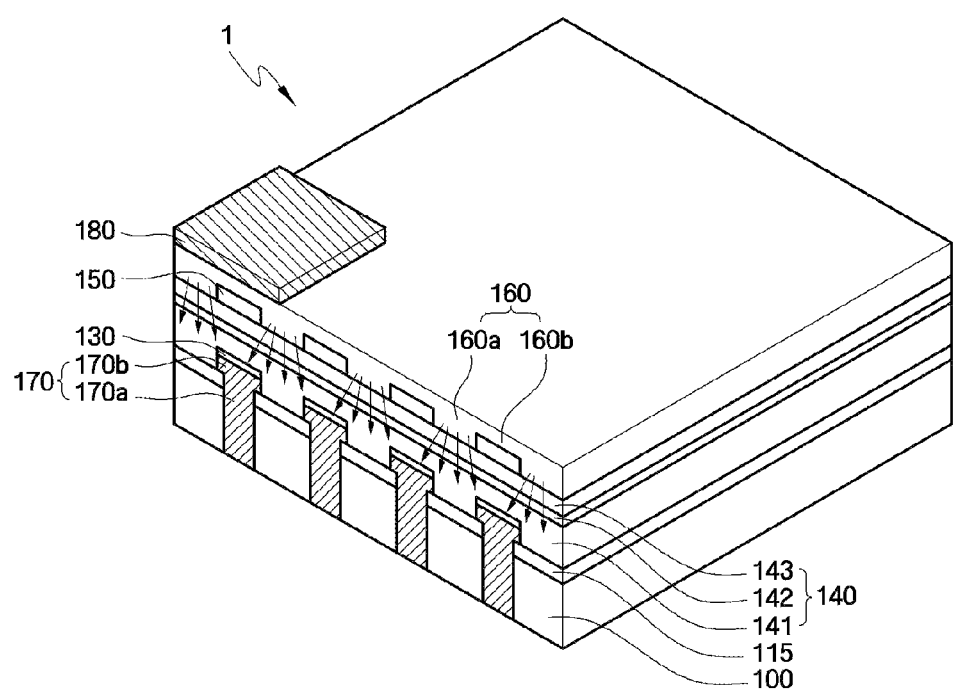
FIG. 3 is a perspective sectional view illustrating current spreading of the light-emitting device according to example embodiments of the inventive concepts.
Figure 4:
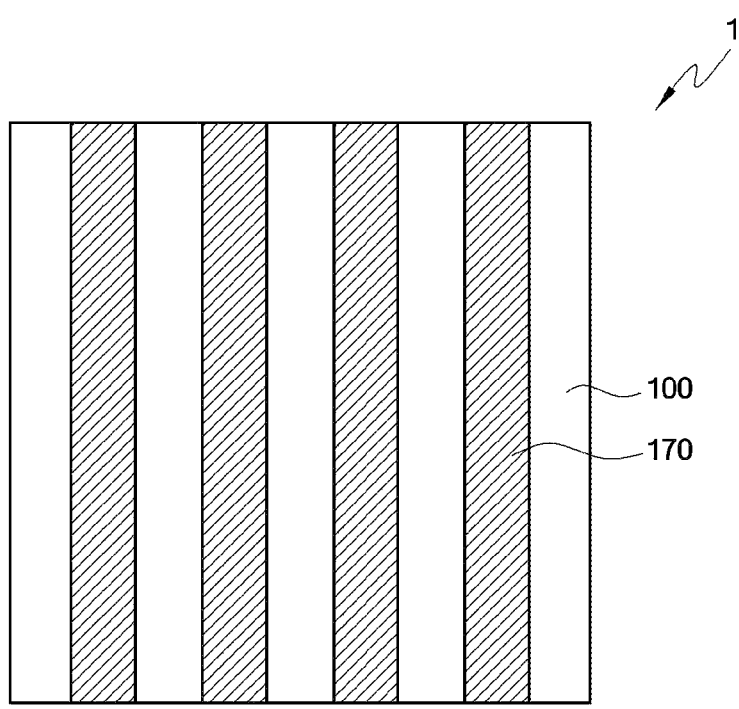
FIG. 4 is a bottom view illustrating a light-emitting element included in the light-emitting device according to example embodiments of the inventive concepts.

FIG. 1 is a perspective view illustrating a light-emitting device according to example embodiments of the present inventive concepts. FIG. 2 is a sectional view taken along a line I-I' of FIG. 1 illustrating a light-emitting device according to example embodiments of the present inventive concepts. FIG. 3 is a perspective sectional view illustrating current spreading of the light-emitting device according to example embodiments of the present inventive concepts. FIG. 4 is a bottom view illustrating a light-emitting element included in a light-emitting device according to example embodiments of the present inventive concepts.

Referring to FIGS. 1 and 2, the light-emitting device according to example embodiments includes a light-emitting element 1 installed on a support substrate 200.

The light-emitting element 1 includes a light-emitting structure layer 140 having a first conductive layer 141, a light-emitting layer 142 and a second conductive layer 143, which are sequentially formed on one side of the substrate 100. The light-emitting element 1 includes a plurality of seed layer patterns 130 formed in the first conductive layer 141, and a plurality of first electrodes 170 formed through the substrate 100. In addition, the light-emitting element 1 can include a buffer layer pattern 115 placed between the first conductive layer 141 and the substrate 100. A current spreading pattern 150 may be placed on the second conductive layer 143. A contact layer 160 may be formed to cover the current spreading pattern 150 and the second conductive layer 143. A second electrode 180 may be formed on the contact layer 160.

The substrate 100 in example embodiments may be a dielectric substrate. As an example of dielectric substrate, a sapphire substrate or a sapphire substrate including gallium nitride formed on top is illustrated. Because the substrate 100 is composed of dielectric substrate, the substrate 100 and the first electrode 170 do not become a short circuit even when the first electrode 170 described below is formed through the substrate 100.

The buffer layer pattern 115 is formed on one side of the substrate 100. The buffer layer pattern 115 may be composed of $In_xAl_yGa_{(1-x-y)}N$ ($0 \leq x \leq 1$, $0 \leq y \leq 1$) series, $Si_xC_yN_{(1-x-y)}$ ($0 \leq x \leq 1$, $0 \leq y \leq 1$) series or ZnO series, without impurity doping. Specifically, such buffer layer pattern 115 may be selected from the group consisting of GaN, AlGaN, AlN, InGaN, SiC, ZnO and combinations thereof.

The buffer layer pattern 115 facilitates growth of the light-emitting structure layer 140 and prevents the light-emitting structure layer 140 from deterioration of electrical characteristics. When the first conductive layer 141 is formed directly on the substrate 100, lattice constant between the first conductive layer 141 and the substrate 100 mismatches and defects can occur in the first conductive layer 141. In example embodiments, because the first conductive layer 141 is formed on the buffer layer pattern 115, defects may be reduced. To reduce (or prevent) defects, the buffer layer pattern 115, for example, is formed with a thickness of from about 1-μm to about 10-μm. This is because defects occur when separation distance between the first conductive layer 141 and the substrate 100 is more than the above thickness.

The light-emitting structure layer 140 is formed on the buffer layer pattern 115. The light-emitting structure layer 140 includes the first conductive layer 141 of a first conductive type (e.g., n type), a second conductive layer 143 of a second conductive type (e.g., p type), the light-emitting layer 142 placed between the first conductive layer 141 and the second conductive layer 143. The first conductive layer 141, the light-emitting layer 142 and the second conductive layer 143 are placed sequentially. The first conductive layer 141, the light-emitting layer 142 and the second conductive layer 143 may include $In_xAl_yGa_{(1-x-y)}N$ ($0 \le x \le 1$, $0 \le y \le 1$) (various materials including GaN). For example, the first conductive layer 141, the light-emitting layer 142 and the second conductive layer 143 may be AlGaN or InGaN.

The light-emitting layer 142 is a region where carriers of the first conductive layer 141 (e.g., electrons) are combined with carriers of the second conductive layer 143 (e.g., holes) to generate light. The light-emitting layer 142, although not illustrated in the drawings in detail, may be composed of a well layer and a barrier layer, and because the well layer has smaller band gap than that of the barrier layer, carriers (electrons and holes) are gathered and combined in the well layer. Such light-emitting layer 142 can be categorized as a Single Quantum Well (SQW) or a Multiple Quantum Well (MQW) structure depending on the number of well layers. A SQW structure contains one well layer and a MQW structure includes multiple (or several) well layers. To control light emission characteristics, at least one selected from the group consisting of boron (B), phosphorous (P), silicon (Si), magnesium (Mg), zinc (Zn), selenium (Se) and combinations thereof may be doped into at least one of the well layer and the barrier layer.

The multiple seed layer patterns 130 are formed apart each other in the first conductive layer 141. The seed layer pattern 130 can be used as a seed when forming the first electrode 170 by using electroplating or electroless plating. The seed layer pattern 130, for example, may be formed with a metal (e.g., CrN, Ti, Ti/W or combinations thereof). In example embodiments, multiple seed layer patterns 130 may be placed such that the plan view is in a shape of stripe. The multiple seed layer patterns 130 can be placed with predetermined (or set) period and can have the same sectional width $W_2$.

Multiple via holes 70 are formed through the substrate 100. Each via holes 70 extends from the other side of the substrate 100 to each of the seed layer pattern 130. The sectional shape of the via hole 70 in a direction from one side to the other side of the substrate 100 may be a "T" shape having an extended width at the seed layer pattern 130. Specifically, a first part 70a of the via hole 70, which penetrates through the substrate 100, may have a rectangular pillar shape with a first width $W_1$ and be placed between the buffer layer patterns 115. A second part 70b of the via hole 70, which is in a plate shape having larger width than the first width $W_1$, may have a second width $W_2$. The seed layer pattern 130 is exposed and the first conductive layer 141 is partially exposed by the second part 70b of the via hole 70.

The first electrode 170 may be formed to fill in the via hole 70 entirely. In this case, because the shape of the first electrode 170 is identical to the shape of the via hole 70, a first part 170a of the first electrode 170 that penetrates through the substrate 100 is placed between the buffer layer patterns 115. A second part 170b of the first electrode 170 can be in direct contact with the seed layer pattern 130 and the first conductive layer 141. Also, referring to FIG. 4, although the plan shape of first electrode 170 can be a stripe type similar to the seed layer pattern 130, the plan shape of the first electrode 170 has a smaller width than that of the seed layer pattern 130.

The first electrode 170 may be composed of materials having increased heat conduction and electric conduction characteristics. Example materials include silver (Ag), titanium (Ti), copper (Cu), nickel (Ni), aluminum (Al), chromium (Cr), gold (Au), platinum (Pt), vanadium (V), tungsten (W), molybdenum (Mo) and combinations thereof. The first electrode 170 can be formed by using electroplating or electroless plating to fill in the via hole 70 from the seed layer pattern 130. The first electrode 170 may be easily formed, and damage to the light-emitting structure layer 140 during the formation processes of the first electrode 170 may decrease.

Because the first electrode 170 is formed on the other side of the substrate 100, the surface area of the light-emitting structure layer 140 formed on one side of the substrate 100 is not decreased. As such, when forming the first electrode 170, a decrease in light emission efficiency may be prevented. Because example embodiments illustrate a vertical type element where the first electrode 170 is formed on the other side of the substrate 100 and a second electrode 180 described below is formed on one side of the substrate 100, the surface areas of the first conductive layer 141, the light-emitting layer 142 and the second conductive layer 143 are practically the same and light-emitting area loss decreases. Also, because the first electrode 170 is formed to fill in the via hole 70 entirely, heat dissipation efficiency of the light-emitting element 1 increases. However, the first electrode 170 may be formed along a sidewall and a bottom of the via hole 70.

A plurality of current spreading patterns 150 are formed on the second conductive layer 143, and the contact layer 160 is formed on the current spreading pattern 150 and the second conductive layer 143. The second electrode 180 may be formed on the contact layer 160 at one side of the light-emitting element 1.

Referring to FIGS. 1 and 3, the current spreading patterns 150 are formed under the contact layer 160 and overlap with the first electrodes 170.

The current spreading pattern 150 spreads current. To accomplish this, the current spreading pattern 150 may be composed of dielectric materials including $SiO_x$ and $SiN_x$. The current applied to the second electrode 180 spreads into a pair of the first electrodes 170, which overlap with the pair of current spreading patterns 150 located on both sides of the first part 160a and through the first part 160a of the contact layer 160 placed between a pair of the current spreading patterns 150. This is because the current applied to the second electrode 180 is blocked by the current spreading pattern 150 in a second part 160b of the contact layer 160 and can only flow through the first part 160a to the first electrode 170. Because current is spread in directions of arrows illustrated in FIG. 3, an entire area of the light-emitting layer 142 may be effectively used as light-emitting area and as a result the light emission efficiency of the light-emitting element 1 increases.

The contact layer 160 may be composed of transparent conductive materials including ITO (Indium Tin Oxide), zinc oxide (ZnO), indium oxide ($In_2O_3$), tin oxide ($SnO_2$) and combinations thereof. Light generated from the light-emitting layer 142 can exit to the outside through the contact layer 160.

The second electrode 180 may be formed on one edge of the light-emitting element 1. The second electrode 180 may be composed of a transparent, or a non-transparent metal. Specifically, in the case of a non-transparent metal, it may be composed of a reflective metal including aluminum (Al) and silver (Ag).

The light-emitting element 1 may be installed on the support substrate 200. The support substrate 200, for example, may be a printed circuit board where circuit patterns are printed.

The first electrode 170 of the light-emitting element 1 is in direct contact with a first power supply pattern 210 on the support substrate 200, and the second electrode 180 is wire-bonded to a second power supply pattern 220. The second power supply pattern 220 may be composed of material having electro conductivity and thermal conductivity. Because a plurality of second electrodes 180 are directly connected to the second power supply pattern 220, heat dissipation efficiency may increase.

Although not illustrated in the drawings, the first power supply pattern 210 and the second power supply pattern 220 on a support substrate 200 may be connected to an additional circuit to drive the light-emitting element 1.

Hereinafter, referring to FIGS. 5A through 8, a method of fabricating a light-emitting device according to example embodiments of the present inventive concepts is described. FIGS. 5A through 8 are sectional views illustrating fabrication processes of the light-emitting device according to example embodiments of the present inventive concepts. In the following example embodiments, for the identical reference numbers are assigned to identical components. In such cases, a description thereof may be omitted or simplified for the sake of brevity.

Figure 5A:
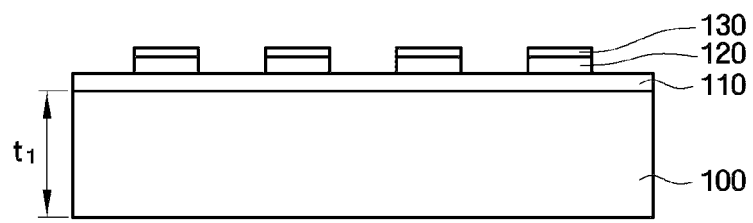
FIGS. 5A through 8 are sectional views illustrating fabrication processes of a light-emitting device according to example embodiments of the inventive concepts.
Figure 5B:
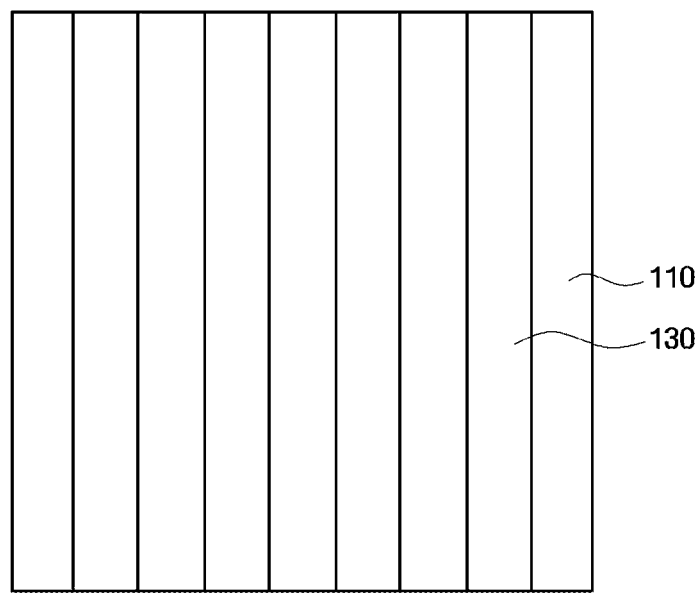

Referring to FIGS. 5A and 5B, for example by using Epitaxial Lateral Over Growth (ELOG) with metal organic chemical vapor deposition (MOCVD), a buffer layer 110 is formed on one side of a substrate 100.

In this step, a thickness t1 of the substrate 100 may be thicker than that of the substrate 100 of a final structure to prevent (or reduce) damage during formation of multiple (or several) layers on the substrate 100.

A method of forming the buffer layer 110 is not limited to the method described above. Liquid phase epitaxy, hydride vapor phase epitaxy, molecular beam epitaxy and metal organic vapor phase epitaxy (MOVPE) may be used to form the buffer layer 110.

On the buffer layer 110, a device isolation layer (not shown) and a seed layer (not shown) are formed and etched to form a device isolation pattern 120 and a seed layer pattern 130. The device isolation pattern 120 may be composed of a dielectric material including $SiO_x$ and $SiN_x$.

The device isolation pattern 120 and the seed layer pattern 130 may be formed in a stripe shape as illustrated in FIG. 5B, which is a plan figure seen from one side of the substrate 100.

Figure 6:
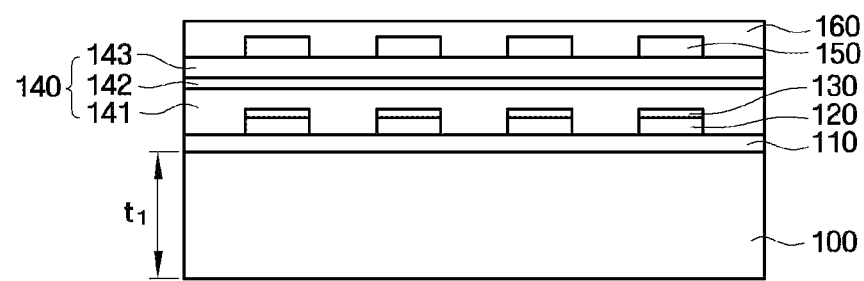

Referring to FIG. 6, on the seed layer pattern 130 and the buffer layer 110, a first conductive layer 141, a light-emitting layer 142 and a second conductive layer 143 are sequentially formed to provide a light-emitting structure layer 140. The light-emitting structure layer 140 may be formed by using Epitaxial Lateral Over Growth (ELOG) with metal organic chemical vapor deposition (MOCVD). Because the first conductive layer 141 is formed on the buffer layer 110 and the seed layer pattern 130, it is easy to grow the first conductive layer 141 and defects due to lattice mismatch between the first conductive layer 141 and the substrate 100 may decrease.

A method of forming the light-emitting structure layer 140 is not limited to the method described above. Liquid phase epitaxy, hydride vapor phase epitaxy, molecular beam epitaxy, and metal organic vapor phase epitaxy (MOVPE) may be used to form the light-emitting structure layer 140.

After forming the second conductive layer 143, annealing may be performed to activate the second conductive layer 143.

A dielectric layer for current spreading pattern (not shown) is formed on the second conductive layer 143 and patterned to provide a current spreading pattern 150. The current spreading pattern 150 may overlap with the seed layer pattern 130.

A contact layer 160 is formed on the second conductive layer 142 and the current spreading pattern 150. The contact layer 160, for example, may be formed by using sputtering, CVD (Chemical Vapor Deposition) or E-beam evaporation.

Figure 7:
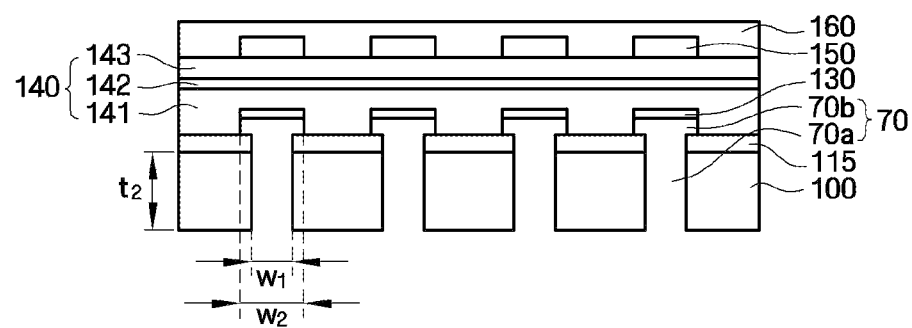

Referring to FIGS. 6 and 7, chemical mechanical planarization (CMP) is performed on the other side of the substrate 100 to reduce the thickness of the substrate 100 from t1 to t2. As such, in the following processes, a dry etch process may be easily performed to form a via hole 70.

By dry etching the other side of the substrate 100, a first part 70a of the via hole 70 (which penetrates the substrate 100 and the buffer layer 110) is formed. The first part 70a of the via hole 70 overlaps with the device isolation pattern 120 and has a width $w_1$ smaller than a width $w_2$ of the device isolation pattern 120. As such, the first part 70a of the via hole 70 exposes the device isolation pattern 120, and the buffer layer pattern 115 is formed. In this case, the device isolation pattern 120 functions as an etch stop pattern and prevents the via hole 70 from damaging the seed layer pattern 130.

By injecting an etchant (e.g., HF) into the first part 70a of the via hole 70, the device isolation pattern 120 is etched. As such, a second part 70b of the via hole 70 is formed.

Figure 8:
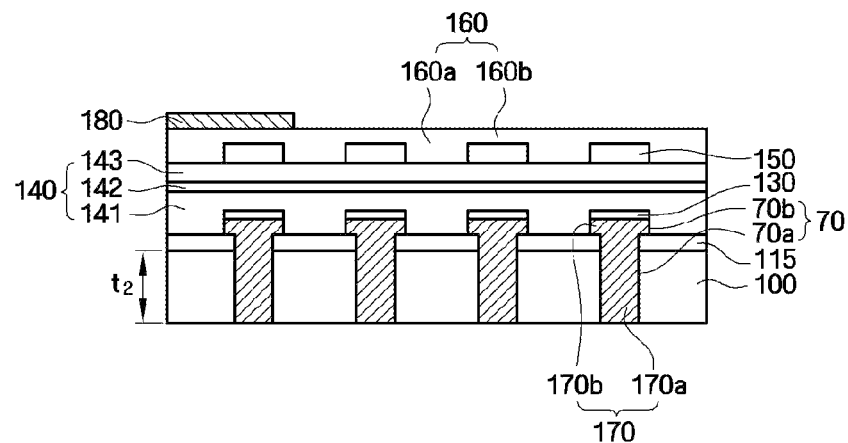

Referring to FIG. 8, when using electroplating, electroplating equipment (not shown) including a cathode and an anode formed in electrolyte solution is provided. The cathode of the electroplating equipment is connected to the product, and the anode is connected to conductive material for a first electrode 170. In this case, an electrolyte solution can include cations of the conductive material for the first electrode 170.

The cathode is connected to the anode by using a direct current power supply device. As such, cations and electrons of the conductive material for the first electrode 170 are generated due to oxidation reaction on the anode. The cations of the conductive material for the first electrode 170 are dissolved in the electrolyte solution and electrons move to the cathode through wire. Electrons accumulated in the cathode meet cations of the conductive material for the first electrode 170 and reduction reaction occurs. In this case, a reduction reaction for the conductive material of first electrode 170 begins on the seed layer pattern 130 exposed by the second part 70b of the via hole 70. When the reduction reaction has substantially progressed, the entire portion of the first part 70a and the second part 70b of the via hole 70 are filled with the first part 170a and the second part 170b of the first electrode 170.

A second electrode 180 is deposited on the contact layer 160. Forming the second electrode 180 on the contact layer 160 can be performed before performing the Chemical Mechanical Planarization (CMP) process on the other side of the substrate 100.

Referring to FIG. 2, the first electrode 170 is in direct contact with a first power supply pattern 210, and the second electrode 180 is connected to a second power supply pattern 220 through a wire 230. A light-emitting element 1 is installed on a support substrate 200 to provide a light-emitting device.

Figure 9:
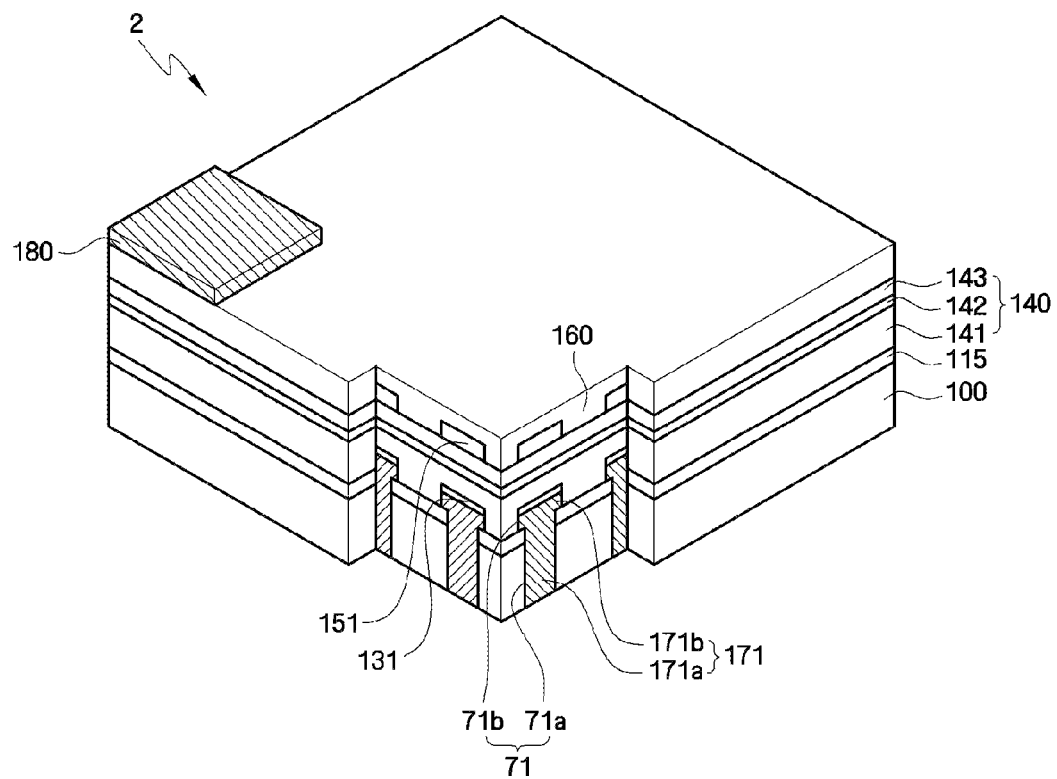
FIG. 9 is a perspective sectional view illustrating a light-emitting device according to example embodiments of the inventive concepts.
Figure 10:
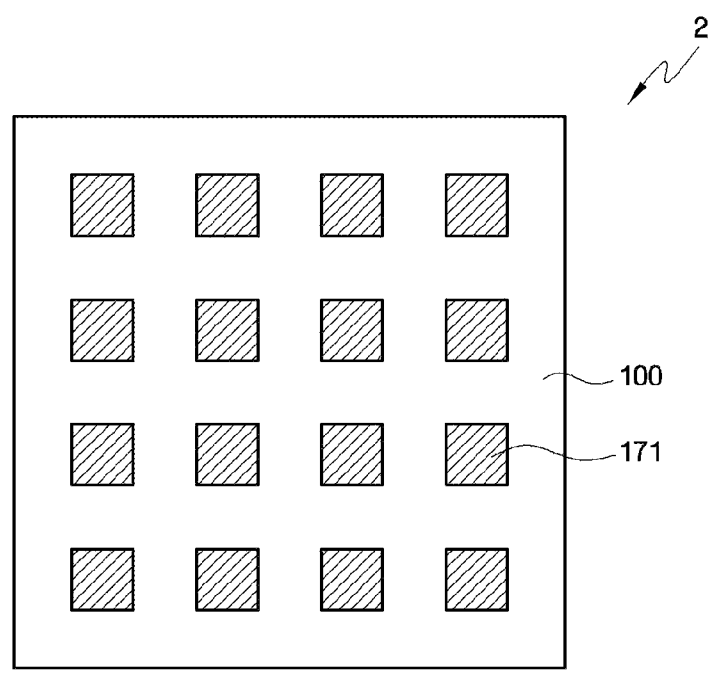
FIG. 10 is a bottom view illustrating a light-emitting element included in a light-emitting device according to example embodiments of the inventive concepts.

Referring to FIGS. 9 and 10, a light-emitting device according to example embodiments of the present inventive concepts is described in detail. FIG. 9 is a perspective sectional view illustrating a light-emitting device according to example embodiments of the present inventive concepts. FIG. 10 is a bottom view illustrating a light-emitting element included in the light-emitting device according to example embodiments of the present inventive concepts.

Referring to FIGS. 9 and 10, in a light-emitting element 2 included in the light-emitting device according to example embodiments, a seed layer pattern 131, a current spreading pattern 151 and a first electrode 171 are placed in a dot-type configuration.

The plane shape of each of the seed layer pattern 131, the current spreading pattern 151 and the first electrode 171 may be a polygon shape. A first part 171a of the first electrode 171 may be a rectangular pillar where the plane shape in a direction parallel to the substrate 100 is a square, and a second part 171b of the first electrode 171 may have a square plane shape having a square plane area larger than the square plane area of the first part 171a.

Referring to FIG. 9 and FIGS. 11A through 13, a light-emitting device according to example embodiments of the present inventive concepts is described in detail. FIGS. 11A through 13 are sectional views illustrating fabrication processes of a light-emitting device according to example embodiments of the present inventive concepts.

Figure 11A:
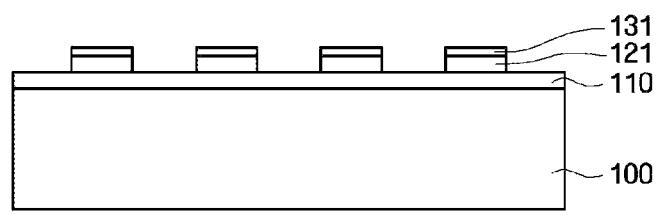
FIGS. 11A through 13 are sectional views illustrating fabrication processes of a light-emitting device according to example embodiments of the inventive concepts.
Figure 11B:
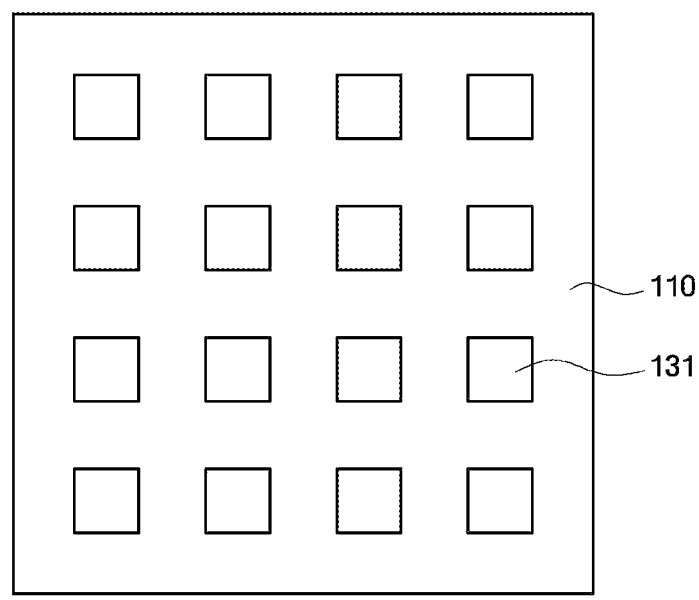

Referring to FIGS. 11A and 11B, a buffer layer 110 is formed on one side (or surface) of a substrate 100.

A device isolation layer (not shown) and a seed layer (not shown) are formed on the buffer layer 110 and etched to form a device isolation pattern 121 and a seed layer pattern 131. The device isolation pattern 121 and the seed layer pattern 131 may be patterned in a dot-type configuration as illustrated in FIG. 11B, which is a plan view seen from one side of the substrate 100.

Figure 12:
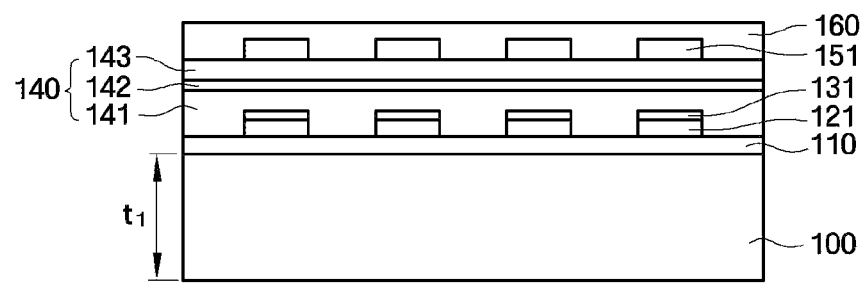

Referring to FIG. 12, a first conductive layer 141, a light-emitting layer 142 and a second conductive layer 143 are sequentially formed on the seed layer pattern 131 and the buffer layer 110 to provide a light-emitting structure layer 140.

A dielectric layer for a current spreading pattern (not shown) is formed on the second conductive layer 143 and patterned to provide a current spreading pattern 151. The current spreading pattern 151 may overlap with the seed layer pattern 131. The current spreading pattern 151 may be formed in a dot-type configuration. a contact layer 160 is formed on the second conductive layer 143 and the current spreading pattern 151.

Figure 13:
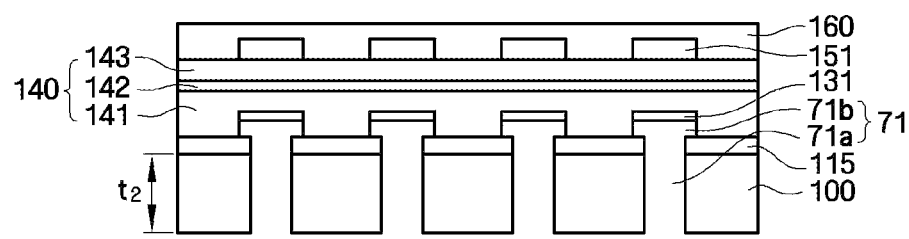

Referring to FIG. 13, chemical mechanical planarization (CMP) is performed on the other side of the substrate 100 to reduce the thickness of the substrate 100, and a first part 71a of a via hole 71 is formed. By etching and removing the device isolation pattern 121, a second part 71b of the via hole 71 is formed.

Referring to FIG. 9, a first electrode 171 is formed by performing electroplating. A first part 171a and a second part 171b of the first electrode 171 (which correspond to the first part 71a and the second part 71b of the via hole 71) are formed.

Figure 14:
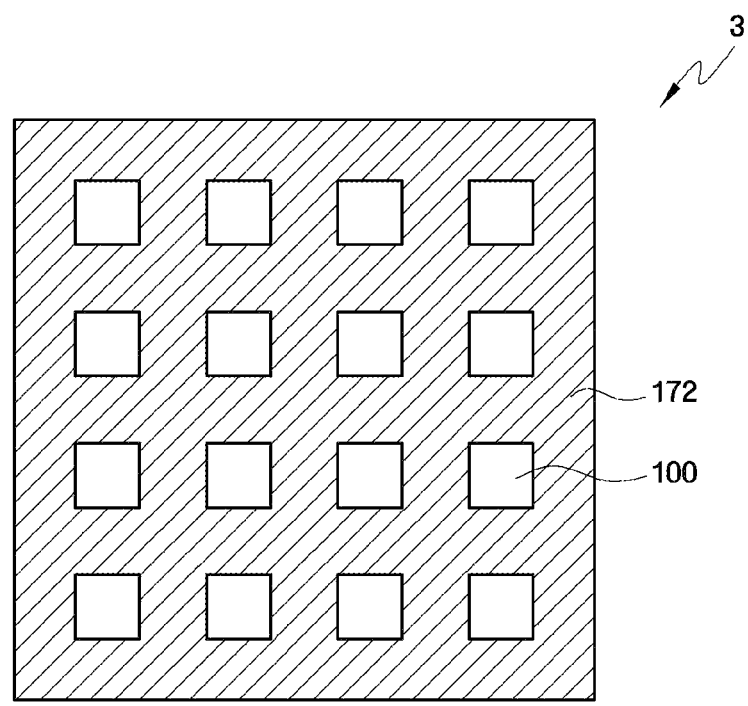
FIG. 14 is a bottom view illustrating a light-emitting element included in a light-emitting device according to example embodiments of the inventive concepts.

Hereinafter, referring to FIG. 14, a light-emitting device according to example embodiments of the present inventive concepts is described. FIG. 14 is a bottom view illustrating a light-emitting element included in the light-emitting device according to example embodiments of the present inventive concepts.

Referring to FIG. 14, the plane shape of a first electrode 172 is in a mesh type. Because the first electrode 172 is formed in a mesh type, heat dissipation efficiency of the first electrode 172 may increase.

Similar to the plane shape of the first electrode 172, a plane shape of a via hole (not shown), a plane shape of a seed layer pattern (not shown), and a plane shape of a current spreading pattern (not shown), which correspond the shape of the first electrode 172, may be formed in a mesh type.

Because the fabrication method according to example embodiments may be inferred from the above example embodiments, some explanations are omitted for the sake of brevity.

A light-emitting device according to example embodiments of the present inventive concepts will now be described.

Figure 15:
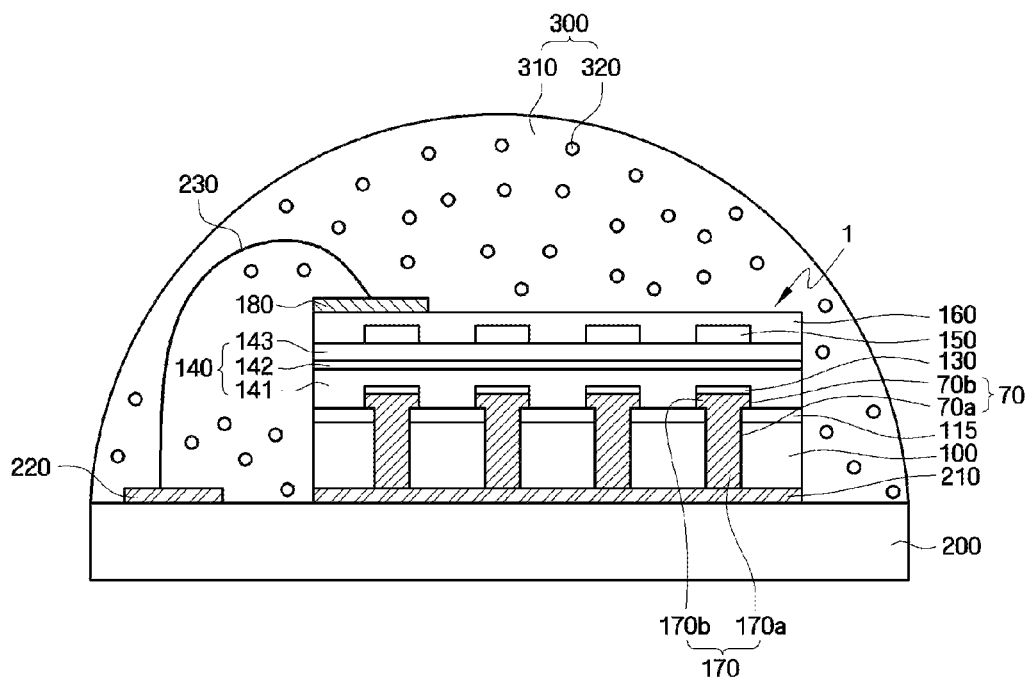
FIG. 15 is a sectional view illustrating a light-emitting device according to example embodiments of the inventive concepts.

FIG. 15 is a sectional view illustrating a light-emitting device according to the example embodiments of the present inventive concepts.

Referring to FIG. 15, the light-emitting device according to example embodiments is different from the previous example embodiments such that a phosphorescence layer 300 including transparent resin 310 (which surrounds a light-emitting element 1) and phosphors 320 (which is spread in, or throughout, the transparent resin 310) are included additionally.

The phosphorescence layer 300 may be formed by mixing the transparent resin 310 and the phosphors 320. Because the phosphors 320 (which is spread in the phosphorescence layer 300) absorbs light generated from a light-emitting element 1 and transforms the wavelength of the absorbed light, better distribution of the phosphors 320 produces better light emission characteristics. In this case, wavelength transformation and color mixing effects caused by the phosphor 320 may increase. As illustrated in the drawings, the phosphorescence layer 300 may be formed on a support substrate 200 to protect a wire 230 such that the phosphorescence layer 300 is placed higher than the wire 230.

For example, the phosphorescence layer 300 may be formed for the light-emitting device according to example embodiments to generate white light. When the light-emitting element 1 emits light of blue wavelength, the phosphors 320 can include yellow phosphors and red phosphors can be included to increase the Color Rendering Index (CRI). When the light-emitting element 1 emits light of UV wavelength, the phosphors 320 can include RGB (Red, Green, and Blue).

Any material that can spread the phosphor 320 stably can be used for the transparent resin 310. For example, resin including epoxy resin, silicon resin, hard silicon resin, modified silicon resin, urethane resin, oxetane resin, acrylic resin, polycarbonate resin and polyimide resin may be used.

The phosphor 320 is a material which can absorb light from a light-emitting structure and transform light into a different wavelength. For example, the phosphorescence layer 60 can be at least one selected from the group consisting of nitride/oxynitride phosphor, alkaline earth halogen apatite phosphor (which is mostly activated by lanthanoid series elements including europium (Eu) and transition metal series elements including manganese (Mn)), alkaline earth metal boron halogen phosphor, alkaline earth metal aluminate phosphor, alkaline earth silicate, alkaline earth sulfide, alkaline earth thiogallate, alkaline earth silicon nitride, germinate, rare earth aluminate (which is mostly activated by lanthanoid series elements including cerium (Ce)), rare earth silicate, organic compound and organic complex (which are mostly activated by lanthanoid series elements including Eu) and combinations thereof. However, example embodiments are not limited thereto.

The nitride phosphor which is mostly activated by lanthanoid series elements including Eu and Ce includes $M_2Si_5N_8$:Eu (M is at least one selected from the group consisting of Sr, Ca, Ba, Mg and Zn). In addition to $M2Si_5N_8$:Eu, $MSi_7No_{10}$:Eu, $M_{1.8}Si_5O_{0.2}N_8$:Eu, $Mo_{0.9}Si_7O_{0.1}N_{10}$:Eu (M is at least one selected from the group consisting of Sr, Ca, Ba, Mg and Zn) may be included.

The oxynitride phosphor which is mostly activated by lanthanoid series elements including Eu and Ce includes $MSi_2O_2N_2:Eu$ (M is at least one selected from the group consisting of Sr, Ca, Ba, Mg and Zn).

The alkaline earth halogen apatite phosphor which is mostly activated by lanthanoid series elements including Eu and transition metal series elements including Mn includes $M_5(PO_4)_3X:R$ (M is at least one selected from the group consisting of Sr, Ca, Ba, Mg and Zn, X is at least one selected from the group consisting of F, Cl, Br and I, and R is at least one selected from the group consisting of Eu and Mn).

The alkaline earth metal boron halogen phosphor includes $M_2B_5O_9X:R$ (M is at least one selected from the group consisting of Sr, Ca, Ba, Mg and Zn, X is at least one selected from the group consisting of F, Cl, Br and I, and R is at least one selected from the group consisting of Eu and Mn).

The alkaline earth metal aluminate phosphor includes $SrA_2O_4:R$, $Sr_4Al_{14}O_{25}:R$, $CaAl_2O_4:R$, $BaMg_2Al_{16}O_{27}:R$, $BaMg_2Al_{16}O_{12}:R$, and $BaMgAl_{10}O_{17}:R$ (R is at least one selected from the group consisting of Eu and Mn).

The alkaline earth sulfide phosphor includes $La_2O_2S:Eu$, $Y_2O_2S:Eu$, and $Gd_2O_2S:Eu$.

The rare earth aluminate phosphor which is mostly activated by lanthanoid series elements including Ce includes YAG series phosphor such as $Y_3Al_5O_{12}:Ce$, $(Y_{0.8}Gd_{0.2})_3Al_5O_{12}:Ce$, $Y_3(Al_{0.8}Ga_{0.2})_5O_{12}:Ce$, and $(Y,Gd)_3(Al,Ga)_5O_{12}$. Also, $Tb_3Al_5O_{12}:Ce$, $Lu_3Al_5O_{12}:Ce$. Also, other phosphors include $Tb_3Al_5O_{12}:Ce$ and $Lu_3Al_5O_{12}:Ce$ where part of Y, or entire Y, is substituted with terbium (Tb) or lutetium (Lu).

The alkaline earth silicate phosphor can include silicate. An example of the alkaline earth silicate phosphor includes $(SrBa)_2SiO_4:Eu$.

Other phosphor includes $ZnS:Eu$, $Zn_2GeO_4:Mn$, $MGa_2S_4:Eu$ (wherein M is at least one selected from the group consisting of Sr, Ca, Ba, Mg and Zn, and X is at least one selected from the group consisting of F, Cl, Br and I).

The previously described phosphors may contain at least one selected from the group consisting of Tb, Cu, Ag, Au, Cr, Nd, Dy, Co, Ni, Ti and combinations thereof to replace Eu or to be added to Eu.

Other phosphors that have the identical performance and effect to those of the previously described phosphors can be used.

Although the light-emitting element 1 according to this example embodiment is illustrated by using the light-emitting element 1 used in a light-emitting device according to the above example embodiments, it is obvious that the light-emitting devices according to other example embodiments may be used in this example embodiment. To aid understanding, the following example embodiments are illustrated with the light-emitting element 1 according to the above example embodiments of the present inventive concepts.

Hereinafter, a light-emitting device according to example embodiments of the present inventive concepts will now be described.

Figure 16:
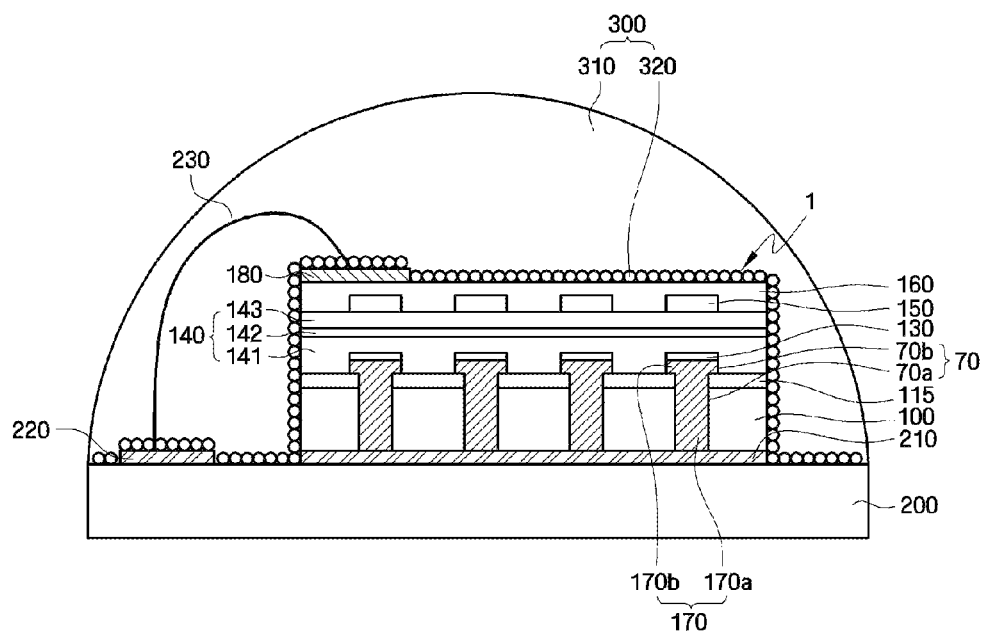
FIG. 16 is a sectional view illustrating a light-emitting device according to example embodiments of the inventive concepts.

FIG. 16 is a sectional view illustrating the light-emitting device according to a example embodiments of the present inventive concepts.

Referring to FIG. 16, phosphors 320 are spread over a support substrate 200 and a light-emitting element 1. In this step, the phosphors 320 may be dissolved in volatile material, for example acetone, and spread. The volatile material (e.g., acetone) is removed by applying heat to be volatile. As such, the phosphors 320 are placed to cover a top of the support substrate 200 and a top and sides of the light-emitting element 1. Thus, light generated from the light-emitting element 1 is emitted into the surrounding air through the phosphors 320.

Light-emitting systems according to example embodiments of the present inventive concepts will now be described.

FIGS. 17 through 21 are views illustrating light-emitting systems according to example embodiments of the present inventive concepts.

Figure 17:
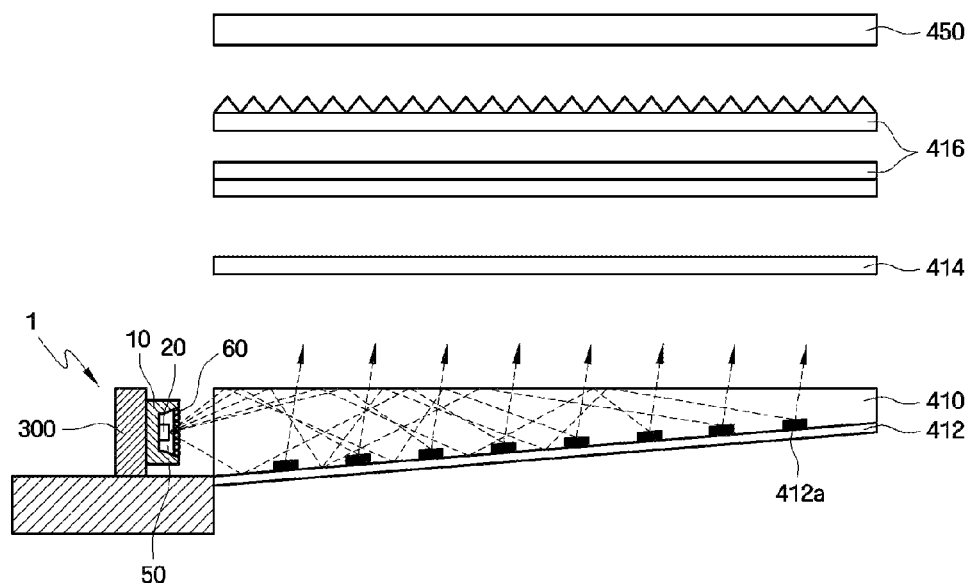
FIGS. 17 through 21 are drawings illustrating light-emitting systems according to example embodiments of the inventive concepts.

FIG. 17 illustrates a system (end product) to which a light-emitting device according to example embodiments of the present inventive concepts is applied to. The light-emitting system may be used in various devices including lighting devices, display devices and mobile devices (cellular phones, MP3 players, navigations). The device illustrated in FIG. 17 is an edge-type Back Light Unit (BLU) used in Liquid Crystal Display (LCD) device. Because LCDs do not include a self light source, BLU is used as a light source and BLU mainly emits light from the back of LCD panel.

Referring to FIG. 17, the BLU includes a light-emitting device 1, a light guide plate 410, a reflection plate 412, a diffusion sheet 414 and a pair of prism sheets 416.

The light-emitting device 1 provides light. Here, the light-emitting device 1 used may be a side view type light-emitting device. As described previously, the light-emitting device 1 can adjust a level of driving power and control color temperature of white light. By controlling color temperature of white light generated from the light-emitting device used in the BLU, the mood of a picture displayed on the liquid crystal panel 450 may be controlled and pictures with the feel (or touch) of a user may be created.

The light guide plate 410 guides light supplied to a liquid crystal panel 450. The light guide plate 410 is formed with a transparent material (e.g., acrylic resin) which is a series of plastic, and it moves light created from the light-emitting device 1 towards the liquid crystal panel 450 placed on the light guide plate 410. Thus, on a rear side of the light guide plate 410, various kinds of patterns 412a are printed to change movement direction of light entered into the light guide plate 410 towards the liquid crystal panel 450.

The reflection plate 412 is installed on a bottom side of the light guide plate 410 and reflects light discharged to the bottom of the light guide plate 410. The reflection plate 412 reflects light which is not reflected by the various kinds of patterns 412a towards an output face of the light guide plate 410. As such, light loss is reduced and/or uniformity of light that penetrates the output face of the light guide plate 410 increases The diffusion sheet 414 diffuses light that comes out of the light guide plate 410 and prevents light from partial congestion.

Prisms in a triangular shape are formed in a uniform arrangement on the prism sheet 416.

FIGS. 18 through 21 are drawings illustrating light-emitting systems according to example embodiments of the present inventive concepts.

Figure 18:
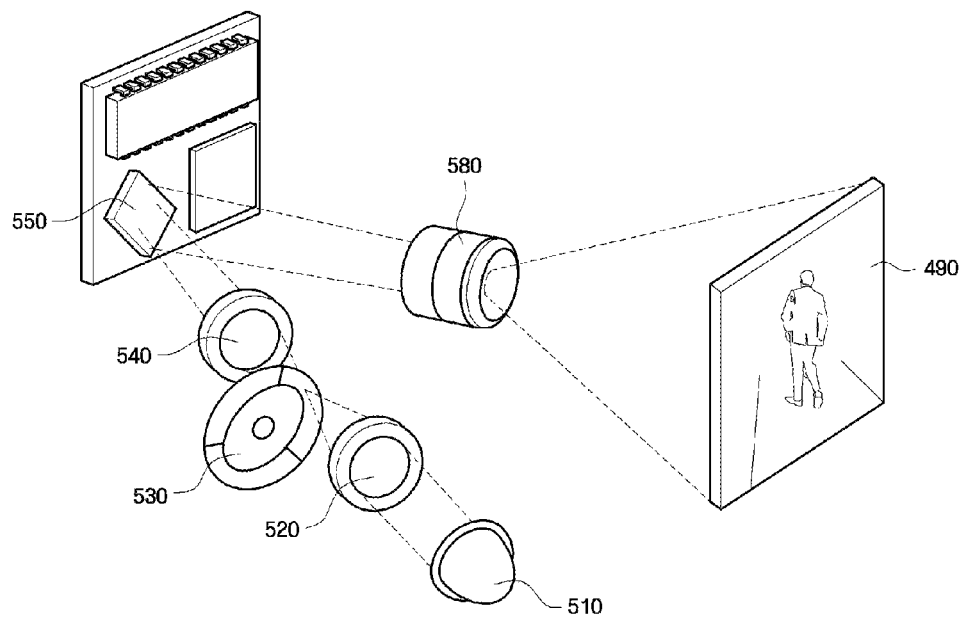
Figure 19:
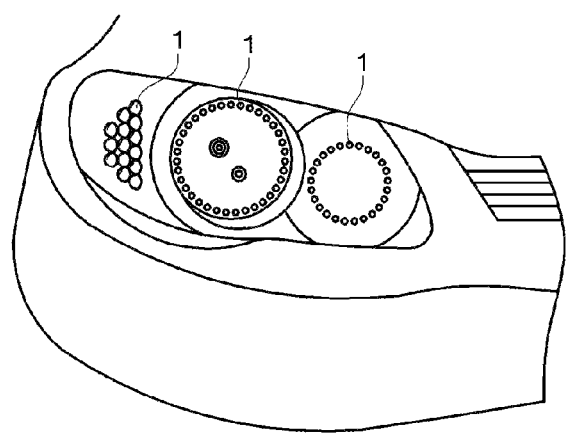
Figure 20:
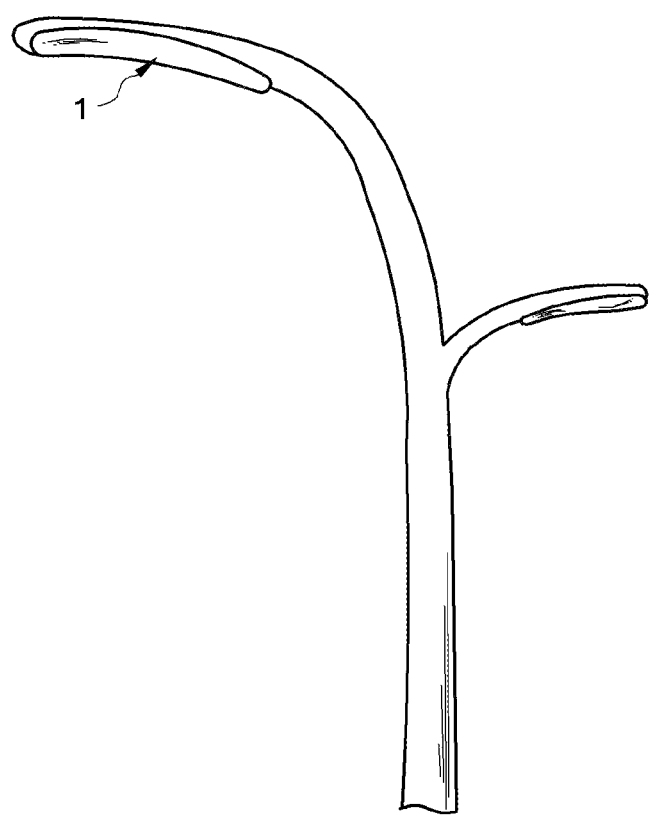
Figure 21:
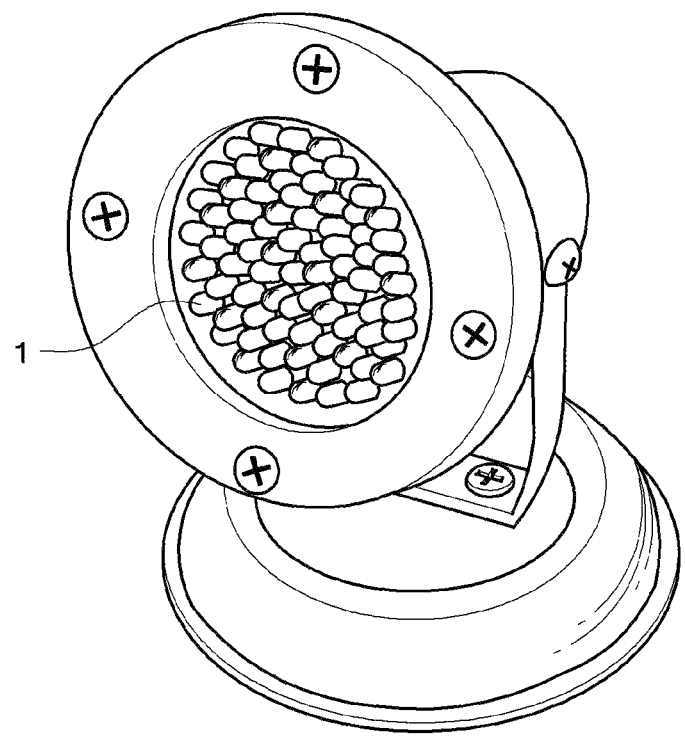

FIG. 18 illustrates a projector. FIG. 19 illustrates a headlight of a car. FIG. 20 illustrates a streetlight. FIG. 21 illustrates a light lamp. The light-emitting device used in FIGS. 18 through 21 can be a top view type light-emitting device.

Referring to FIG. 18, light from a light source 510 passes a condensing lens 520, a color filter 530 and a sharping lens 440, and is reflected by a digital micro-mirror device (DMD) 550. The reflected light passes a projection lens 580, and arrives at a screen 590. Inside the light source 510, the light-emitting device according to example embodiments is installed.

For the headlight of the car in FIG. 19, the streetlight in FIG. 20 and the light lamp in FIG. 21, if color temperature of white light generated by the light-emitting device is controlled by changing driving power applied to the double-sided light-emitting device by using a variable resistor, various moods may be directed.

A method of fabricating a light-emitting system according to example embodiments may be inferred from the method of fabricating the light-emitting device according to example embodiments of inventive concepts.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A light-emitting device, comprising:
    a substrate including a via hole, wherein the via hole includes a first via hole penetrating through the substrate and a second via hole on the first via hole, and wherein a width of the second via hole is larger than a width of the first via hole;
    an electrode filling the via hole;
    a light-emitting element on the substrate;
    phosphors on the light-emitting structure; and
    a transparent resin having a dome shape surrounding the light-emitting element on the substrate.

2. The light-emitting device of claim 1, wherein the transparent resin includes one resin selected from at least one of an epoxy resin, a silicon resin, a hard silicon resin, a modified silicon resin, a urethane resin, an oxetane resin, an acrylic resin, a polycarbonate resin and a polyimide resin.

3. The light-emitting device of claim 1, wherein the electrode is composed of a material selected from at least one of silver (Ag), titanium (Ti), copper (Cu), nickel (Ni), aluminum (Al), chromium (Cr), gold (Au), platinum (Pt), vanadium (V), tungsten (W), molybdenum (Mo) and combinations thereof.

4. The light-emitting device of claim 1, wherein the light-emitting element emits light having a blue wavelength, and the phosphors include yellow and red phosphors.

5. The light-emitting device of claim 1, wherein the light-emitting element emits light having a UV wavelength, and
    the phosphors include RGB (Red, Green, and Blue) phosphors.

6. The light-emitting device of claim 1, wherein the phosphors are each composed of a material that absorbs light from the light-emitting element and transforms light into a different wavelength, and
    the phosphors are at least one selected from a group consisting of nitride/oxynitride phosphor, alkaline earth halogen apatite phosphor, alkaline earth metal boron halogen phosphor, alkaline earth metal aluminate phosphor, alkaline earth silicate, alkaline earth sulfide, alkaline earth thiogallate, alkaline earth silicon nitride, germinate, rare earth aluminate, rare earth silicate, organic compound and organic complex and combinations thereof.

7. The light-emitting device of claim 6, wherein the nitride phosphor is composed of a material selected from at least one of $M_2Si_5N_8$:Eu, $MSi_7N_{10}$:Eu, $M_{1.8}Si_5O_{0.2}Ns$:Eu, and $M_{0.9}Si_7O_{0.1}N_{10}$:Eu,
    wherein M is at least one selected from the group consisting of Sr, Ca, Ba, Mg and Zn.

8. The light-emitting device of claim 6, wherein the rare earth aluminate phosphor is composed of a material including a YAG series phosphor, and
    the YAG series phosphor is selected from at least one of $Y_3Al_5O_{12}$:Ce, $(Y_{0.8}Gd_{0.2})_3A_{15}O_{12}$:Ce, $Y_3(Al_{0.8}Ga_{0.2})_5O_{12}$:Ce, and $(Y,Gd)_3(Al,Ga)_5O_{12}$, $Tb_3Al_5O_{12}$:Ce, and $Lu_3Al_5O_{12}$:Ce.

* * * * *